(12) United States Patent
Rasmussen

(10) Patent No.: US 6,373,070 B1
(45) Date of Patent: Apr. 16, 2002

(54) METHOD APPARATUS FOR A COAXIAL OPTICAL MICROSCOPE WITH FOCUSED ION BEAM

(75) Inventor: Jorgen Rasmussen, Beaverton, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 09/415,644

(22) Filed: Oct. 12, 1999

(51) Int. Cl.[7] .................... G21K 5/10; G21K 7/00; G01N 23/00
(52) U.S. Cl. ............... 250/492.21; 250/306; 250/492.1
(58) Field of Search ................. 250/492.21, 310, 250/306

(56) References Cited

U.S. PATENT DOCUMENTS

| 3,378,670 A | 4/1968 | Smith et al. ............. 219/121 |
| 3,740,147 A | 6/1973 | Kallet .................... 356/96 |
| 3,878,392 A | 4/1975 | Yew et al. ............... 250/306 |
| 4,440,475 A | 4/1984 | Colliaux ................. 350/502 |
| 4,574,179 A | 3/1986 | Masuzawa et al. ......... 219/121 |
| 4,936,968 A | 6/1990 | Ohnishi et al. .......... 204/192.34 |
| 4,948,941 A | 8/1990 | Altman et al. ........... 219/121.71 |
| 4,982,090 A | 1/1991 | Wittmaack ............... 250/309 |
| 5,055,696 A | 10/1991 | Haraichi et al. ......... 250/492.2 |
| 5,063,280 A | 11/1991 | Inagawa et al. .......... 219/121.7 |
| 5,128,509 A | 7/1992 | Black et al. ............ 219/121.76 |
| 5,146,089 A | 9/1992 | Frosien ................. 250/309 |
| 5,168,166 A | 12/1992 | Hayakawa et al. ......... 250/492.2 |
| 5,401,972 A * | 3/1995 | Talbot et al. ........... 250/491.1 |
| 5,429,730 A | 7/1995 | Nakamura et al. ......... 204/192.34 |
| 5,583,344 A | 12/1996 | Mizumura et al. ......... 250/492.21 |
| 5,770,123 A | 6/1998 | Hatakeyama et al. ....... 264/1.21 |
| 5,808,790 A | 9/1998 | Otaki ................... 359/387 |
| 5,821,549 A | 10/1998 | Talbot et al. ........... 250/307 |
| 5,838,005 A | 11/1998 | Majumdar et al. ......... 250/306 |
| 5,905,266 A * | 5/1999 | Larduinat et al. ........ 250/492.21 |

FOREIGN PATENT DOCUMENTS

| EP | 0 284 683 A2 | 8/1987 | .......... H01J/37/252 |
| JP | 07073834 | 3/1995 | .......... H01L/03/706 |
| JP | 07122484 | 5/1995 | ....... H01L/021/027 |

OTHER PUBLICATIONS

Reynolds G.O.; Develis J.B.; Parrent G.B.; Thompson B.J.: The New Physical Optics Notebook: Tutorials In Fourier Optics, Spie Optical Engineering Press, Bellingham, Washington 1989, pp. 478–479.

M. Utlaut, *Focused Ion Beams, Chapter 11, pp.429–432*, in Handbook Of Charged Particle Optics, (Jon Orloff ed. 1997), CRC Press.

"ion", Dictionary Of Science And Technology, Academic Press; Harcourt, Inc.; http://www.harecourt.com/dictionary/def/5/3/8/9/5389100.html.

* cited by examiner

Primary Examiner—Teresa M. Arroyo
Assistant Examiner—Kalimah Fernandez
(74) Attorney, Agent, or Firm—Michael O. Scheinberg

(57) ABSTRACT

An optical microscope has an optical axis that coincides with a focused ion beam. The optical microscope can be used to locate target features on a specimen for subsequent operations by the ion beam, thereby eliminating the need for complex and potentially inaccurate registration procedures. The optical microscope can use infrared light so that features on a silicon flip chip are observable through the silicon from the backside. The ion beam can then machine the chip to expose the features for subsequent operations.

30 Claims, 7 Drawing Sheets

SECTION A-A

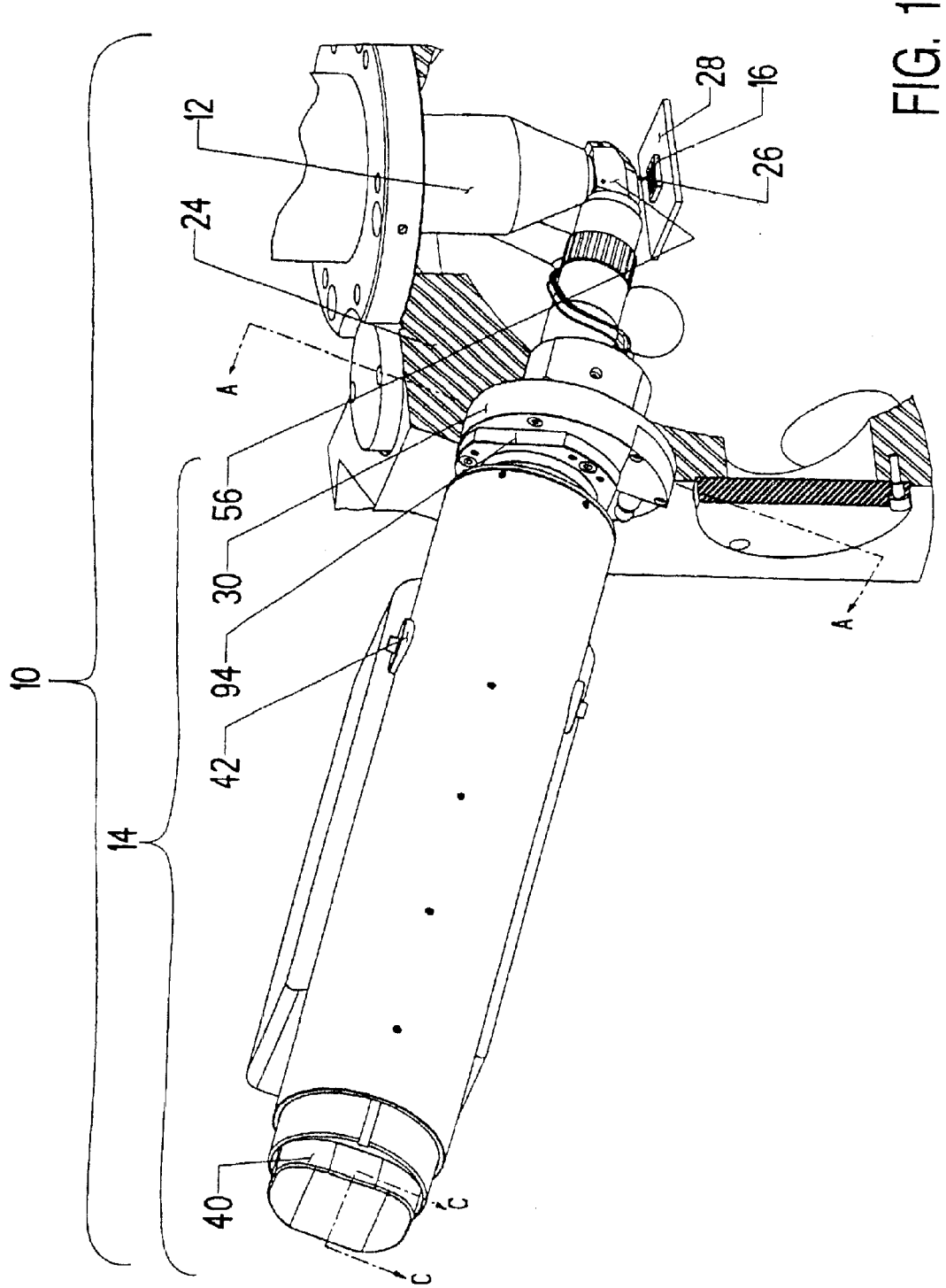

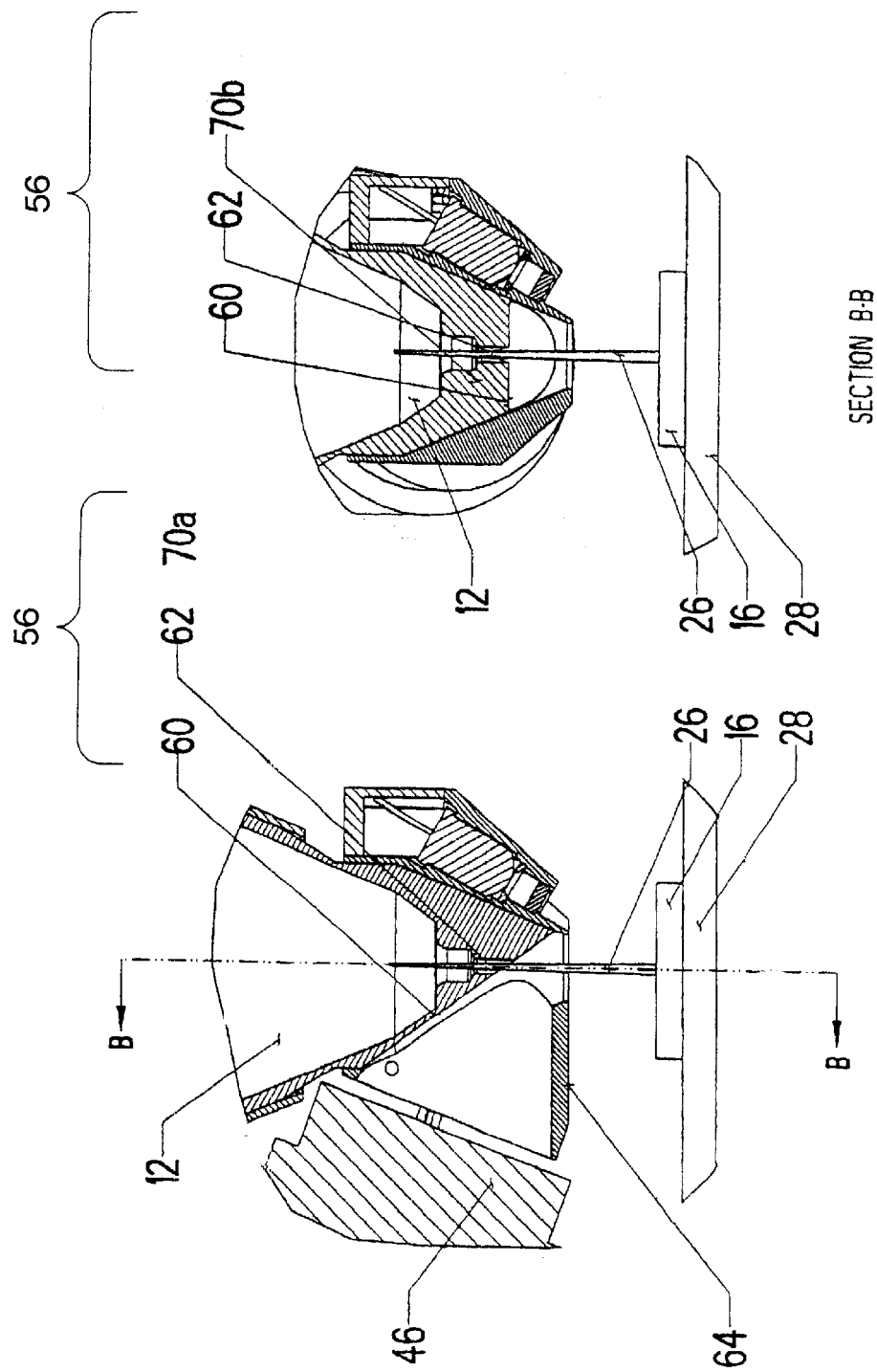

SECTION A-A

SECTION C-C

METHOD APPARATUS FOR A COAXIAL OPTICAL MICROSCOPE WITH FOCUSED ION BEAM

TECHNICAL FIELD OF THE INVENTION

The present invention relates to the field of focused ion beam systems and, in particular, to sample observation and registration in such systems.

BACKGROUND OF THE INVENTION

Focused Ion Beam (FIB) systems are widely used in microscopic-scale manufacturing operations because of their ability to image, etch, mill, deposit, and analyze with great precision. Ion columns on FIB systems using gallium Liquid Metal Ion Source (LMIS), for example, can provide five to seven manometer ($10^{-9}$m) lateral resolution. Because of their versatility and precision, FIB systems have gained universal acceptance in the integrate circuit industry as necessary analytical tools for use in process development, failure analysis, and most recently, defect characterization.

During the manufacturing of integrated circuits, multiple copies of an integrated circuit are fabricated on a semiconductor silicon wafer, which is then severed into rectangular dies, each die including a copy of the integrated circuit. A die is typically several hundred microns thick and has electronic circuit elements fabricated on and slightly below its front side surface. The ion beam of a FIB system scans the surface of the integrated circuit in a raster pattern. This raster pattern produces an image of the surface showing the top lines and elements of the circuit. The image is used to navigate the ion beam around the die to locate a specific element or a feature of the circuit. Upon moving the raster pattern to the local area of the feature of interest and increasing the ion beam current, the ion beam will cut into the die and expose circuit features in buried layers. The FIB system can then alter the exposed circuit by cutting conductive traces to break electrical connections or depositing conductive material to provide new electrical connections. FIB systems often include a Secondary Ion Mass Spectrometer (SIMS), which can determine which chemical elements are present in the exposed features. Technology in the semiconductor industry evolves rapidly, however, and existing tools and techniques may be inadequate for use with new integrated circuit designs.

In use, a semiconductor die is mounted in a package. The package has metal leads for electrically connecting it to a circuit board on which other electrical components are mounted. The die and the package both have bonding pads for establishing electrical connections between the die and the package leads. The connection between the package leads and the die inherently adds undesirable impedance, that is, resistance to electrical flow, between the package leads and the die. As semiconductor devices operate at higher speeds, lower impedances between the package leads and the active elements on the die are required. At the same time, larger and more complex devices and circuits require an increased number of input/output connections, resulting in larger die size and packages.

A response to these needs has been the development of so-called flip-chip or C4 semiconductor manufacturing technology in which the bond connections are arrayed over the front side of a die and align with an array of corresponding bond connections on the package. The die is then placed front side down in the package, with the bond connections on the die contacting those on the package. The connection length and impedance from the active circuit elements to the package pins are reduced, compared with those of older connection technologies, and the number of connections available between the die and the package is increased.

The top layer of the flip-chip die, however, is covered with an array of bond pads, making access to circuit elements from the front surface of the die difficult or impossible, even for unpackaged devices. Thus, conventional analysis and repair tools are often unusable with flip chips. Improved techniques to debug flip-chip devices without damaging them are needed to remove a crucial roadblock in the advancement of flip chip technology and to provide a significant boost in time-to-market for critical IC chips, such as microprocessors. With improved techniques, new circuits can be made and tested within days, not months of receiving a prototype.

Some techniques exist for debugging flip-chips. U.S. Pat. No. 5,821,549 to Talbot et al., for example, describe using laser milling to thin the flip-chip from the backside by cutting a series of steps in the substrate. An infrared optical microscope is then used to locate features of interest on the thinned portion of the flip-chip. The edges of the laser drilled steps are used to register the infrared image with a FIB image, and the FIB is then used to accurately mill down to the feature desired. Thus, the operation requires the use of three instruments, a laser, an optical microscope, and a FIB. Registering the infrared image with the FIB image is difficult, time consuming, and the images are subject to misalignment. Thus, to do efficient FIB operations on flip-chip features, there exists a need for a fast and accurate method of locating features through the back surface of the flip-chip.

In integrated circuit operations, as well as in other applications, a FIB operator typically locates a feature of interest by scanning the ion beam over the specimen while using the imaging to view the specimen. A disadvantage of FIB systems is that the focused ion beam incidentally etches and implants gallium ions in the substrate as it is imaging. Thus, there is a need for a fast and accurate method for aligning an ion beam with specific features on any specimen, particularly ones having sensitive surfaces that can be damaged by the focused ion beam, while minimizing undesirable exposure of the specimen to the ion beam.

SUMMARY OF THE INVENTION

Thus, it is an object of the invention to provide an improved method and apparatus for locating specimen features in a focused ion beam system.

It is another object of the invention to provide such a method and apparatus that minimizes exposure of the specimen to the ion beam.

It is still another object of the invention to provide a focused ion beam system, having an optical microscope for locating specimen features and provide coaxial alignment between the two.

It is a further object of the invention to permit an operator to align a specimen visually and then perform an ion beam operation on the specimen, without moving the specimen to a second instrument or requiring registration with pre-recorded images.

It is yet another further object of the invention to provide a focused ion beam system having a coaxial optical microscope for use with infra-red, visible, or other frequencies of light.

It is still another object of the invention to provide an improved method and apparatus for using a focused ion beam system to operate on flip-chips.

It is a still further object of the invention to provide a method of machining thin-film heads in a focus ion beam system while minimizing the damage to the heads from ion beam imaging.

It is yet a further object of the invention to provide a means for optically processing an integrated circuit with a focused ion beam system.

The present invention comprises a focused ion beam system that includes an optical microscope having an optical axis that substantially coincides with the axis of the focused ion beam as the axes approach a specimen. The axis of the focused ion beam is defined as a line at the center of the beam when positioned at the point defined as zero deflection.

Features on the specimen are located using the image from the optical microscope. When a feature is centered in the image of the optical microscope, the feature will be in the path of the ion beam, when activated. Because the optical image and the FIB image are aligned, the operator can use the optical image to position the ion beam without having to go through a lengthy, less accurate registration procedure that relies on a recorded image and accurate repositioning of a movable specimen stage. With the present invention, the operator uses a live image from the optical microscope to align the focused ion beam with features on the specimen.

The optical microscope can use light of different frequencies for different applications. For example, an optical microscope can use infrared light for viewing features through a layer of silicon or visible light frequencies for viewing a surface feature or a feature under a layer of transparent silicon dioxide. The optical microscope can also direct light from a laser or other light source onto a specimen to process the specimen. The scope of optical processing of the sample in conjunction with the ion beam and gas chemistry is large. Optical Beam Induced Current, OBIC, is one example of measuring the thickness of material as the ion beam is removing the material. Another example is using a laser beam through the optical microscope to heat the sample in a local area under the ion beam. This heating will enhance the gas chemistry between the ion beam and process gasses. In a preferred embodiment, the optical microscope uses an angled mirror at the end of the ion column to reflect light from a specimen into image-forming optical elements. The mirror includes an aperture hole through which the ion beam travels. The preferred embodiment also includes one or more illumination sources and a camera for recording the image and presenting it on a monitor to an operator. One embodiment allows the operator a choice between dark field illumination, provided by light sources in the vacuum chamber or bright field illumination, provided along the optical axis.

Thus, the invention speeds and simplifies locating features on the specimen. Using the optical microscope to locate a feature and position the specimen reduces exposure of the specimen to the scanning focused ion beam, thereby reducing undesirable etching of the specimen, which can damage sensitive specimens, such as thin films. The optical microscope allows rapid positioning of the parts in relation to the ion beam, thus increasing the number of parts that can be machined in a time period and improving the quality of those parts.

The invention is particularly suitable for performing focused ion beam operations on flip chips. Using infrared light, it is possible to look through 100 µm or more of silicon, thereby allowing an operator to locate, from the backside of a thinned die, features that can then be exposed by ion beam milling for other FIB operations.

Additional objects, advantages and novel features of the invention will become apparent from the detailed description and drawings of the invention.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is perspective view of a focused ion beam system having a coaxial optical microscope in accordance with the present invention;

FIG. 3 is an enlarged cross-sectional view showing the mirror assembly of the apparatus of FIG. 2A;

FIG. 4 is an enlarged cross-sectional view showing the mirror assembly of the apparatus of FIG. 2A, the section being taken normal to that of FIG. 3;

DETAILED DESCRIPTION OF PREFERRED EMBODIMENTS

Figure 2A:
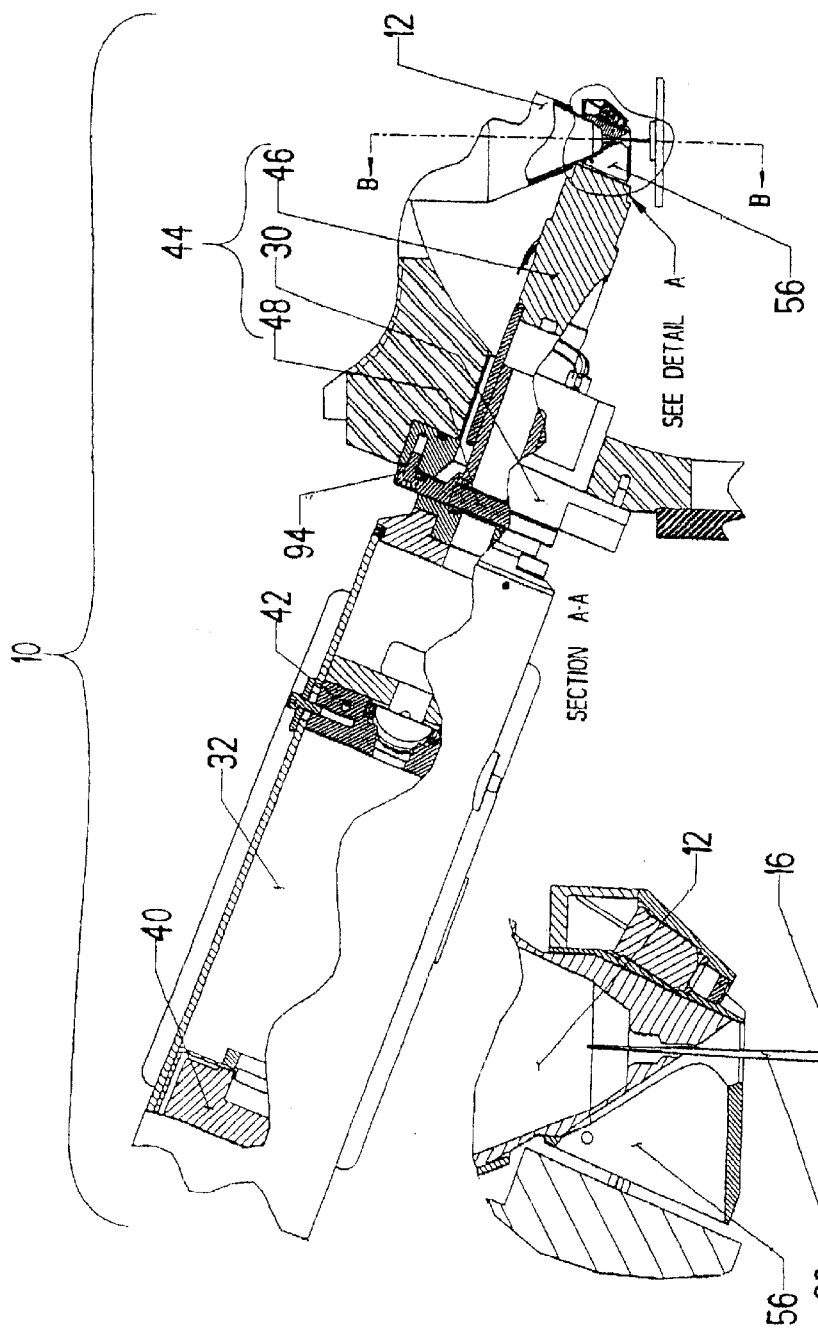
FIG. 2A is a partial cross-sectional view of the coaxial optical microscope apparatus of FIG 1.

General features of a preferred embodiment of a focused ion beam system having a coaxial optical microscope according to the present invention are illustrated in the following figures.

FIG. 1 shows a focused ion beam system 10 of the present invention comprising a focused ion beam column 12 and an optical microscope system 14 for observing a specimen 16 maintained in a vacuum chamber 24. The details of focused ion beam column 12 are known in the art and focused ion beam columns are commercially available, for example, from FEI Company, Hillsboro, Oreg., the assignee of the present invention. Generally, column 12 focuses ions into a sub-micron ion beam 26. Ions are emitted from a liquid metal ion source and directed into ion beam 26 toward the specimen 16, which typically comprises a semiconductor device positioned on a movable X-Y stage 28 within vacuum chamber 24. A main flange 30, is attached to and supported by the wall of the vacuum chamber 24. Most of the components of optical microscope system 14 are supported by the main flange 30.

Figure 2B:
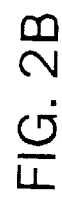
FIG. 2B is a detail view of a portion of the coaxial optical microscope apparatus of FIG. 2A.

FIG. 2A is a partial cross-sectional view of the system of FIG. 1, showing the relationship between the components thereof. FIG. 2 shows that system 10 includes a lens tube 32 mounted on the main flange 30 and supporting a camera 40, an illumination assembly 42 and a lens assembly 44, which comprising an movable objective lens 46 and a fixed lens 48. FIGS. 2A and 2B also shows a mirror assembly 56 supported by the ion beam column 12. Mirror assembly 56 collects the light from specimen 16 and reflects it into lens assembly 44, which includes optical elements for focusing the light to form an image on the image plane of camera 40. Mirror assembly 56 is electrically grounded to minimize electric fields that would tend to affect the path of ions in ion beam 26.

Illumination assembly 42 provides a source of illumination for bright field viewing. Camera 40 is preferably a commercially available CCD camera that detects light incident on an array of a charge-coupled devices. Camera 40 is selected to be sensitive to the frequency of light used to illuminate the sample 16 to form the image on camera 40. The output from camera 40 is displayed on a monitor (not shown) for viewing by an operator, who then adjusts the movable stage 28 to align a desired feature with the optical axis of optical system 14. Once aligned with the optical axis of optical system 14, the feature will also be aligned with axis of the focused ion beam 26. Camera 40 can be positioned at different locations within lens tube 32 to provide the desired field of view. For example, in one embodiment, the zoom range of the camera 40 is from 800 $\mu$m to 250 $\mu$m.

FIG. 3 shows a detailed cross-sectional view of mirror assembly 56 of FIG. 2A. FIG. 4 shows detailed cross-sectional view of mirror assembly 56 taken along lines B—B of FIG. 2A and FIG. 3. FIGS. 3 and 4 shows that mirror assembly 56 includes a mirror 60 on the end of ion column 12. Mirror 60 includes an aperture 62 for passing the ion beam 26 to the sample 16. Aperture 62 is sufficiently large to pass ion beam 26 at maximum deflection without undue defocusing due to any incidental electrostatic field associated with mirror assembly 56, yet sufficiently small to minimize loss of light from specimen 16. Mirror 60 can be a polished portion of the ion objective lens itself or it can be a separate part that is attached to the ion objective lens. Mirror 60 can be planar or curved. Mirror assembly 56 also includes a light shield 64 that prevents stray light from entering objective lens 46.

Mirror assembly 56 includes two light emitting diodes (LED) 70a and 70b that illuminate the specimen 16 when the operator selects dark field illumination. In a preferred embodiment for flip chip repair, LEDs 70a and 70b emit strongly in infrared frequencies. Suitable LEDs are commercially available, for example, from American Bright Optoelectronics Corp. as Model BIR-BM17J4, which have an emission peak at a wavelength of 940 nm and an emission angle of 20 degrees.

Figure 5:
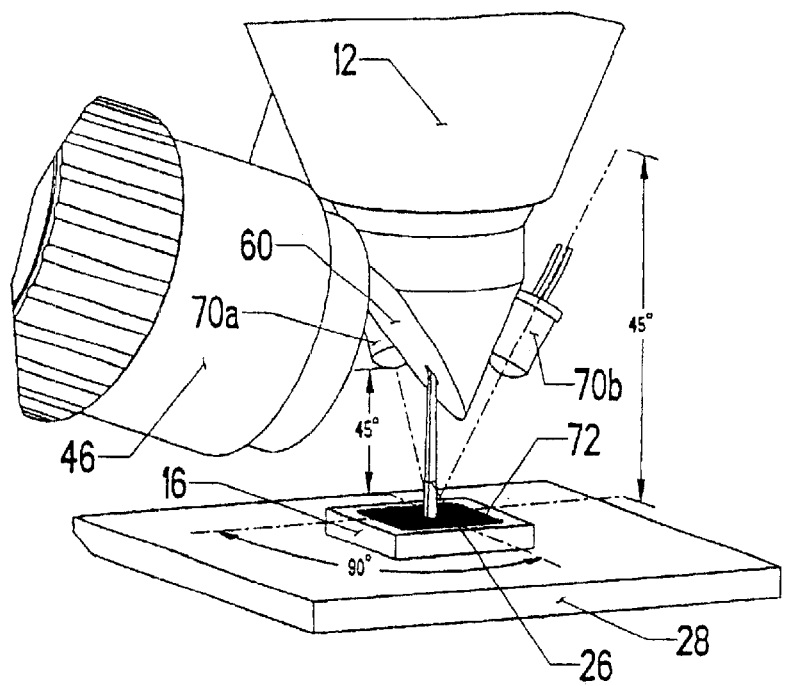
FIG. 5 is a perspective view showing the orientation relationship between the specimen and an illumination source.
Figure 6:
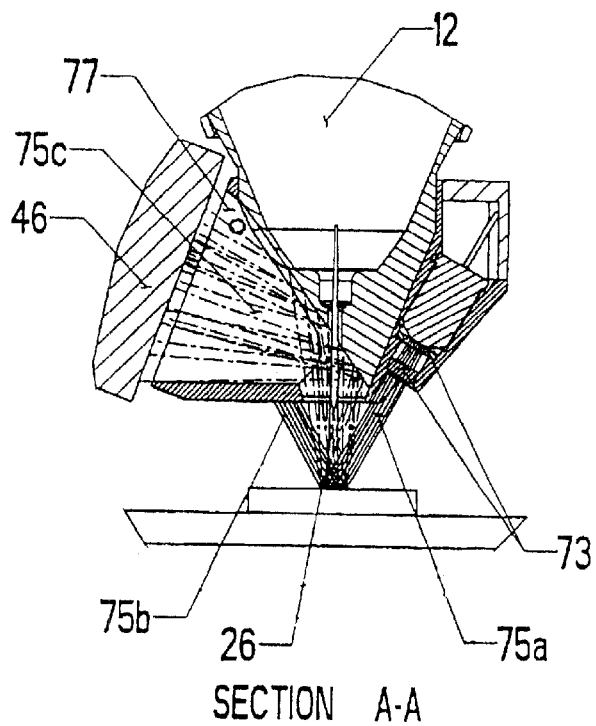
FIG. 6 is similar to FIG. 3 and illustrates the light path in the system of FIG. 1.

FIG. 5 shows the orientation of LEDs 70 with respect to each other and specimen 16. LEDs 70a and 70b are preferably separated by a rotational angle of ninety degrees on mirror assembly 56 so that each LED 70 illuminates specimen 16 at right angles to the other LED 70. FIG. 6, a cross-sectional view similar to FIG. 3, shows light 75a from both LEDs 70 is incident at approximately 45 degrees from the surface of specimen 16. Lines on the integrate circuits are typically laid out on a rectangular grid pattern 72, and specimen 16 is preferably mounted in system 10 so that light from the LEDs 70a and 70b is incident perpendicular to the edges of the rectangular grid. Thus, one LED 70 illuminates primarily the vertical lines of specimen 16 and the other LED 70 illuminates the horizontal lines of specimen 16. LEDs 70 are positioned in relation to mirror 60 so that the light 75b reflected from the specimen is not collected by mirror 60. Only light 75c scattered by the rectangular grid pattern 72 on specimen 16 is directed by mirror 60 into the optical system 14 to form an image in camera 40, thereby providing a dark field image of sample 16's rectangular grid pattern 72.

The light from the LED's is typically exiting the LED at a diversion angle of 20 degrees. To focus the light at the surface of the sample 72, focussing optics 73 can be placed between the LED and the sample 16. This can be achieved by using standard optical components, by having the light exit through small apertures or by placing the center of the LED's elimination point in, or close to the focal point of an elliptical mirror. The other focal point of the ellipse can then be close to or beyond the sample surface. Other sources of focused light, such as fiber optics or laser generated light, can also be used. Using a focused ray of light, as the illumination for the dark field mode will generate back scattered light off the sample surface edges 72, without having reflected light entering the objective lens 46 and on to the camera 40.

Mirror 60 has a gold-coated reflecting surface that reflects approximately 99% of the incident infrared light into objective lens 46 which focuses the infrared light. Suitable lenses for infrared light are commercially available, such as the Mitutoyo Model 378-823 M Plan NIR 10X, which has a numerical aperture of 0.26, a working distance of 30.5 mm, a focal length of 20 mm, a resolving power of 1.1 um, and a depth of focus of 4.1 um.

Mirror assembly 56 prevents any undesirable light 75b from entering objective lens 46. The interior of mirror assembly 56 is coated with carbon die 77 to prevent light scattered from the interior surfaces of assembly 56 from entering into the objective lens 46. None of the light 75a from the LEDs 70 that is specularly reflected enters objective lens 46, except the light 75c that is specularly reflected off the edge of the rectangular grid pattern 72 on specimen 16. Thus, the image formed by objective lens 46 and lens 48 on camera 40, is a dark field image created by the light scattered from the rectangular grid pattern 72 on specimen 16.

Figure 7:
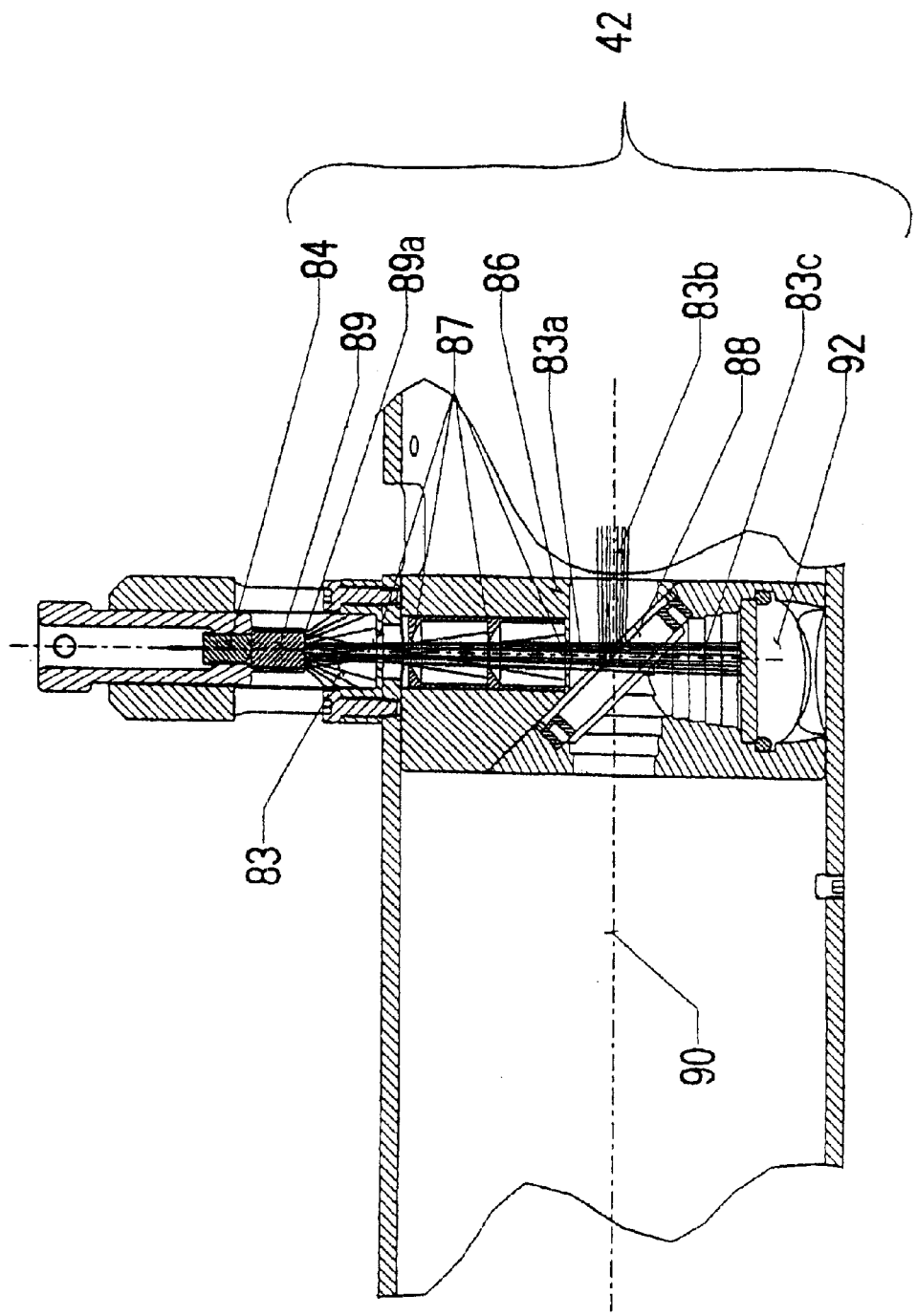
FIG. 7 is an enlarged partial cross-sectional view showing the illumination assembly of FIG. 2A.

FIG. 7 shows an alternative source of illumination, illumination assembly 42, which is used for bright field illumination. Illumination assembly 42 includes a LED 84, which can be the same model as LEDs 70a and 70b of FIG. 3. The direction of the illumination from the infrared LED 84 can be adjusted by moving it in and out and by rotating the beam-splitter housing 86 until the best illumination is observed. The infrared light emitted from LED 84 is transmitted through an acrylic light-pipe 89 having a face 89a through which the light exits light-pipe 89. The surface finish of 89a is a white beat blast finish on the end of the acrylic light pipe 89. Emitting from the surface of 89a is a defused scatter light pattern 83. The light continues through four apertures 87 and only the center of the defused scattered light 83a strikes the beam-splitter 88, which reflects a portion of the incident light 83b through the lens assembly 44 along the optical axis 90 of the optical microscope system 10 to illuminate specimen 16. The remaining, unreflected portion of the incident light 83c is transmitted through beam splitter 88 and absorbed by a heat absorbing filter 92, which is tilted so that the light reflected from its surface will not be reflected off the beam splitter 88 into camera 40. The beam splitter is sufficiently reflective to provide adequate illumination of specimen 16, yet sufficiently transmissive to allow passage of sufficient light back from specimen 16 to form an image at camera 40.

Applicant has found that a suitable beam splitter is a Melles Griot Pellicle Beamsplitter Model 03 BPL001/01, which reflects approximately fifteen percent of the 940 nm light incident from LED 84 towards specimen 16. Heat absorbing filter 92 can be, for example, a Melles Griot Model No. 03 FHA 005, which transmits less than one percent of the incident infrared radiation at 940 nm.

Light reflected from specimen 16 is reflected by mirror 60 into lens system 44, through beam splitter 88, which passes about ninety percent of the infrared light to camera 40.

Figure 8:
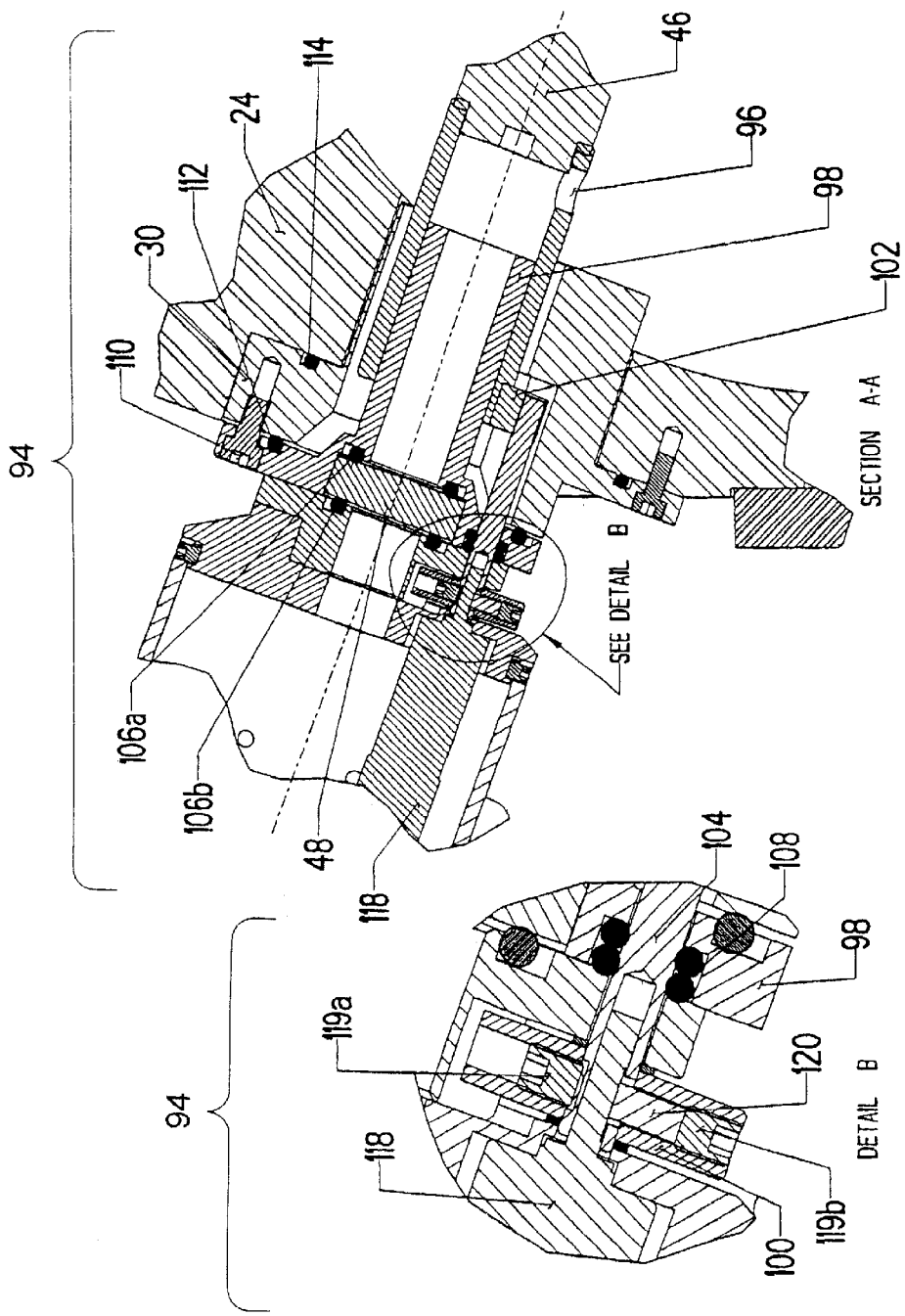
FIG. 8A is a enlarged partial cross-sectional showing the mounting of the lens assembly of FIG. 2A.
FIG. 8B shows a portion of the lens assembly of FIG. 8A further enlarged.

FIGS. 8A and 8B show an adjustment mechanism 94 by which the position of the objective lens 46 (FIG. 3), located near specimen 16 within vacuum chamber 24, is adjusted by a motor 118 from the outside of the vacuum chamber 24. Adjustment mechanism 94 is mounted to main flange 30. Objective lens 46 is mounted on an objective lens tube 96, which is guided toward or away from specimen 16 by a guiding flange 98. To move objective lens 46, an operator rotates a knob 100 or operates the motor 118, which rotates a lead screw 104, causing linear motion of a nut 102 threaded onto the lead screw 104. Nut 102 is attached to objective lens tube 96, and it, together with objective lens 46, moves towards or away from specimen 16. The lead screw 104 is clamped together with the knob 100 by the set screw 119a. The set screw 119b clamps the motor shaft to the knob 100 by applying pressure on the motor shaft through the Teflon safety pin 120. If the load on the motor gets too high the Teflon will slip on the motor shaft. Leaving the set screw 119b loose, the knob can be turned by hand and provide a manual override of the focus. Fixed lens 48 is mounted within adjustment mechanism 94 and is supported between O-rings 106a and 106b. O-ring 106a seals vacuum chamber 24, while O-ring 106b provides pressure to maintain fixed lens 48 in position. O-rings 108 seals between lead screw 104 and guiding flange 98 to allow motion of knob 100 to be transferred into vacuum chamber 24. Guiding flange 98 is attached to the main flange 30 by three screws 110. An O-ring 112 positioned between guiding flange 98 and main flange 30 provides a vacuum seal and spaces guiding flange 98 slightly away from main flange 30. By adjusting the tension on the screws 110, the optical axis of optical system 14 can be adjusted into alignment with the ion beam column 12. Deflecting the ion beam to coincide with the optical axis and setting that deflection as zero deflection performs final alignment. O-ring 114 seals main flange 30 to the wall of vacuum chamber 24.

It is possible to use the entire light spectrum, including ultraviolet, visible, and infrared for viewing different materials. Different lenses are typically required for different frequencies. Optical elements used with the invention can vary from simple glass lenses to high end scanning confocal microscope optics. Such optical elements are typically commercially available. Illumination normal to the surface is ineffective in some instances and that dark field illumination, that is, the image is formed by scattered, as opposed to specularly reflected, light is sometimes preferable. Because dark field illumination requires forming an image with less light than bright field illumination, the number of optical elements in the optics train is minimized to reduce light loss.

When visible light is used with the optical microscope, the operator can see through transparent layers, such as silicon dioxide, that would be opaque to the focused ion beam. When the optical microscope uses infrared light, the operator can see through approximately 100 microns or more of silicon. This is particularly advantageous for focused ion beam milling on the IC chips using flip-chip technology, in which failure analysis must be performed through silicon from the backside of the chip.

Figure 9:
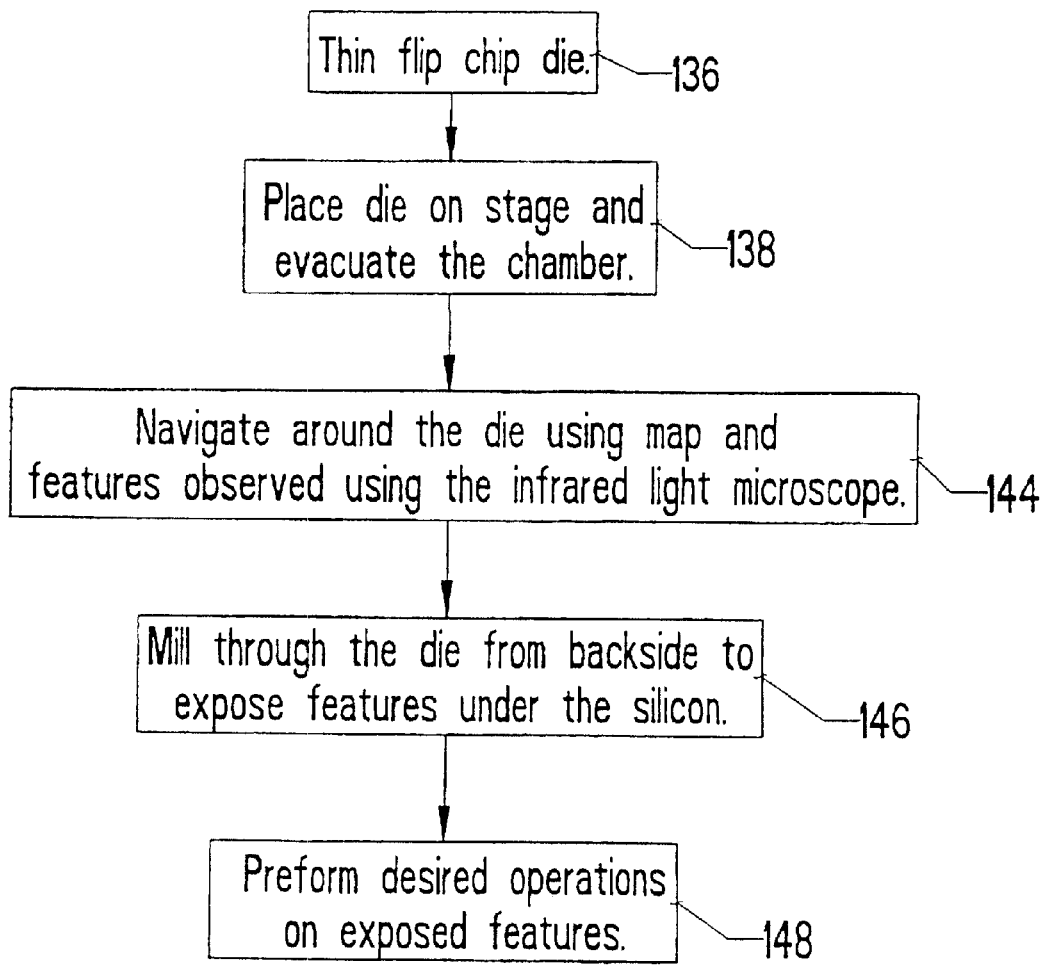
FIG. 9 is a flow chart showing a method of performing focused ion beam operations on a flip-chip.

FIG. 9 is a flow chart showing the steps in a process for focused ion beam operations on a flip-chip. Step 136 shows that the backside of a flip chip die is thinned, preferably by grinding, to a thickness of approximately 100 $\mu$m. Step 138 shows that the die is placed on movable stage 28 in vacuum chamber 24, which is then evacuated. Step 144 shows that the operator uses features of the die identifiable through the optical system 14, to navigate around the die and locate the target circuit feature. Optical system 14 preferably uses dark field illumination and 940 nm infrared light. Upon locating the target feature, step 146 shows that the ion beam is then used to mill through the silicon to expose the target feature. The cross-sectional area of the milled hole will vary with the application, but holes of 10 $\mu$m by 10 $\mu$m, 20 $\mu$m by 20 $\mu$m, or 50 $\mu$m by 50 $\mu$m are typical. The operator can view the milling as it progresses using both optical and ion beam imaging. Because the resolution of the infrared optical system is typically about one or two microns, which is much lower than that of the ion beam, ion imaging may be required for final alignment before operating on the circuit feature. Step 148 shows that the operator can then perform a desired operation on the exposed feature.

The invention is also particularly useful with parts having sensitive surfaces, such as thin film coating. Such parts can be positioned for ion beam milling much more quickly using an optical microscope than with using focused ion beam imaging, and the sensitive surface is not damaged by photons. Such films are used, for example, on write heads for disk drives. An optical system 14 for use in machining such parts will typically use visible light and bright field illumination.

The invention is not limited to gallium liquid metal ion FIBs, but is also applicable to FIBs using other ion sources, such as a duoplasmatron ion source, and primary ions of other species, such as oxygen, argon, nitrogen, etc. The nature of the focused ion beam and the optical system used in practicing the invention also depends upon the nature of the specimen under investigation, the desired ion beam energy and the type of analysis. Other types optical systems and illumination systems can also be used.

It will be understood that when applicants describe the optical axis and the ion beam axis as coinciding or coaxial, it is meant that the optical axis is generally, not necessarily exactly, parallel to the ion beam as it approaches the specimen and that the optical axis at the specimen is near, but necessary at exactly at, the impact point of the ion beam at zero deflection. Moreover, it will be understood that the ion beam scan area is typically a subset of the optical image, and that the areas are not necessarily equal in extent, due to the different resolutions and fields of view of the optical microscope and the ion beam system.

The embodiments described above are merely illustrative and skilled persons can make variations on them without departing from the scope of the invention, which is defined by the following claims.

Although the present invention and its advantages have been described in detail, it should be understood that various changes, substitutions and alterations can be made to the embodiments herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An apparatus for positioning the impact point of a focused ion beam on a specimen, the apparatus comprising:
    an ion source;
    an ion column for focusing ions from the ion source into a beam for impinging on the specimen at a target point the ion column having an ion column axis;
    and an optical microscope having an optical axis, the optical microscope and the ion column configured so that they are substantially coaxial as their axes approach the target point.

2. The apparatus of claim 1 in which the optical microscope includes a mirror positioned between the ion column and the specimen, the mirror reflecting light from the specimen for forming an image.

3. The apparatus of claim 2 in which the mirror is mounted on to the ion column.

4. The apparatus of claim 2 in which the mirror includes an aperture for passing the ion beam.

5. The apparatus of claim 1 further comprising an illumination source for illuminating the specimen.

6. The apparatus of claim 5 in which light from the illumination source approaches the specimen along the optical axis of the optical microscope.

7. The apparatus of claim 5 in which light from the illumination source approaches the specimen at a non-zero angle to the optical axis.

8. The apparatus of claim 5 in which the illumination source comprises one or more light emitting diodes.

9. The apparatus of claim 5 in which the specimen is positioned within a vacuum chamber and in which the illumination source is positioned within the vacuum chamber.

10. The apparatus of claim 5 in which the illumination source illuminates the specimen from two different directions, neither direction being along the optical axis.

11. The apparatus of claim 10 in which the two directions are rotationally spaced ninety degrees apart from each other and are oriented approximately 45 degree to the optical axis.

12. The apparatus of claim 5 in which the illumination source includes at least two light emitting diodes.

13. The apparatus of claim 5 in which the illumination source illuminates the specimen primarily in the infra-red wavelength.

14. The apparatus of claim 5 in which the illumination source illuminates the specimen primarily in the visible wavelength.

15. The apparatus of claim 2 in which the mirror reflects light to form a dark field image of the specimen.

16. The apparatus of claim 2 in which the mirror reflects light to form a bright field image of the specimen.

17. The apparatus of claim 1 further comprising a light source for optically processing the specimen through the optical microscope.

18. A method of positioning the impact point of a focused ion beam at a target point on a specimen, the method comprising:
    Providing an optical microscope having an optical axis and an ion column having column axis, the optical microscope and the ion column configured so that they are substantially coaxial as their axes approach the target point;
    locating the target point using the optical microscope; and
    directing the focused ion beam to target point.

19. The method of claim 18 in which locating a target point using an optical microscope includes illuminating the substrate and forming an image of the specimen using dark field illumination.

20. The method of claim 18 in which locating a target using an optical microscope includes locating a target point using infrared light transmitted through a layer of silicon to locate the target point.

21. The method of claim 18 in which locating a target using an optical microscope includes locating a target using visible light.

22. A method of exposing an integrated circuit feature under a silicon layer, the method comprising:
    illuminating an area including the feature through the layer of silicon using infrared light;
    using dark field infrared light from the specimen collected from an optical path that is substantially coaxial with an ion beam column to form a image of the area;
    locating the feature in the image; and ion beam machining through the silicon layer to access the feature.

23. An apparatus for locating, exposing, and performing focused ion beam operations on features on an integrated circuit under a layer of silicon, comprising:
    an ion source;
    an ion column for focusing ions from the ion source into a beam for impinging on the specimen at a target point, the ion path defining an axis of the ion beam;
    an infrared illumination source illumination
    an optical microscope for viewing an infrared image of the specimen, the optical microscope having an optical axis that is substantially coaxial with the axis of the ion beam at the target point, the optical microscope thereby including the target of the ion column in its field of view.

24. The apparatus of claim 1 in which the optical microscope includes an optical element positioned between the ion column and the specimen, the optical element reflecting light from the specimen for forming an image.

25. The apparatus of claim 1 in which the ion column includes an electrostatic objective lens.

26. The method of claim 18 in which directing the focused ion beam to the target point includes focusing the ion beam using an electrostatic objective lens.

27. The method of claim 26 in which locating the target point using the optical microscope includes deflecting image-forming light from the sample away from the ion beam before the image-forming light passes through the electrostatic objective lens.

28. The method of claim 18 in which the specimen includes features having lines running primarily in two directions and in which the method further comprises illuminating the specimen from two directions that corresponds to the two primary directions of the lines.

29. The method of claim 22 in which using dark field infrared light from the specimen collected from an optical path that is substantially coaxial with an ion beam column to form a image of the area includes directing the dark field infrared light away from an axis of the ion beam column for detection.

30. The apparatus of claim 23 in which the optical microscope includes an optical element for directing the infrared light from the specimen away from the axis of the ion beam.

* * * * *